US012696488B2

(12) United States Patent
Chen et al.

(10) Patent No.: US 12,696,488 B2
(45) Date of Patent: Jul. 28, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chao-Hsuan Chen, Hsinchu (TW); I-Wei Yang, Yilan (TW); Shu-Yuan Ku, Hsinchu (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 386 days.

(21) Appl. No.: 18/414,702

(22) Filed: Jan. 17, 2024

(65) Prior Publication Data

US 2025/0234594 A1     Jul. 17, 2025

(51) Int. Cl.
| | |
|---|---|
| *H10D 30/67* | (2025.01) |
| *H10D 30/01* | (2025.01) |
| *H10D 30/43* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 84/83* | (2025.01) |
| *H10P 14/60* | (2026.01) |
| *H10P 50/28* | (2026.01) |

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01); *H10D 64/017* (2025.01); *H10D 84/0135*

(2025.01); *H10D 84/038* (2025.01); *H10D 84/83* (2025.01); *H10P 14/6339* (2026.01); *H10P 50/283* (2026.01)

(58) Field of Classification Search
CPC ..... H10D 62/121; H10D 30/024; H10D 30/62
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

FOREIGN PATENT DOCUMENTS

| | | |
|---|---|---|
| CN | 113764272 | 12/2021 |
| TW | 202109761 | 3/2021 |

*Primary Examiner* — Evren Seven
(74) *Attorney, Agent, or Firm* — NZ Carr Law Office

(57) ABSTRACT

Embodiments of the present disclosure provide a method for forming a semiconductor device structure. The method includes forming a fin structure over a substrate, forming an insulating material adjacent the fin structure, depositing a gate dielectric layer over the fin structure and the insulating material, depositing a gate electrode layer on the gate dielectric layer, forming an opening through the gate electrode layer and the gate dielectric layer into the insulating material, then performing an etch process that etches the gate dielectric layer at a faster rate than the gate electrode layer, and filling the opening with a dielectric material.

20 Claims, 19 Drawing Sheets

(56)　　　　　　References Cited

U.S. PATENT DOCUMENTS

| | | | | |
|---|---|---|---|---|
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 11,616,061 | B2 * | 3/2023 | Tsai | H10D 84/0151 |
| | | | | 257/401 |
| 2021/0343600 | A1 * | 11/2021 | Chen | H10D 64/017 |
| 2021/0359126 | A1 * | 11/2021 | Wang | H10D 84/038 |
| 2022/0036935 | A1 * | 2/2022 | Wang | H10B 51/30 |
| 2022/0270971 | A1 * | 8/2022 | Wang | H10D 30/6735 |
| 2022/0271139 | A1 * | 8/2022 | Su | H10D 30/6735 |
| 2022/0320088 | A1 * | 10/2022 | Pan | H10D 64/017 |
| 2025/0285869 | A1 * | 9/2025 | Chen | H10D 64/01326 |

* cited by examiner

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-11A are cross-sectional side views of various stages of manufacturing the semiconductor device structure taken along line A-A of FIG. 6, in accordance with some embodiments.

FIGS. 7B-11B are cross-sectional side views of various stages of manufacturing the semiconductor device structure taken along line B-B of FIG. 6, in accordance with some embodiments.

FIGS. 7C-11C are cross-sectional side views of various stages of manufacturing the semiconductor device structure taken along line C-C of FIG. 6, in accordance with some embodiments.

DETAILED DESCRIPTION

Figure 1:
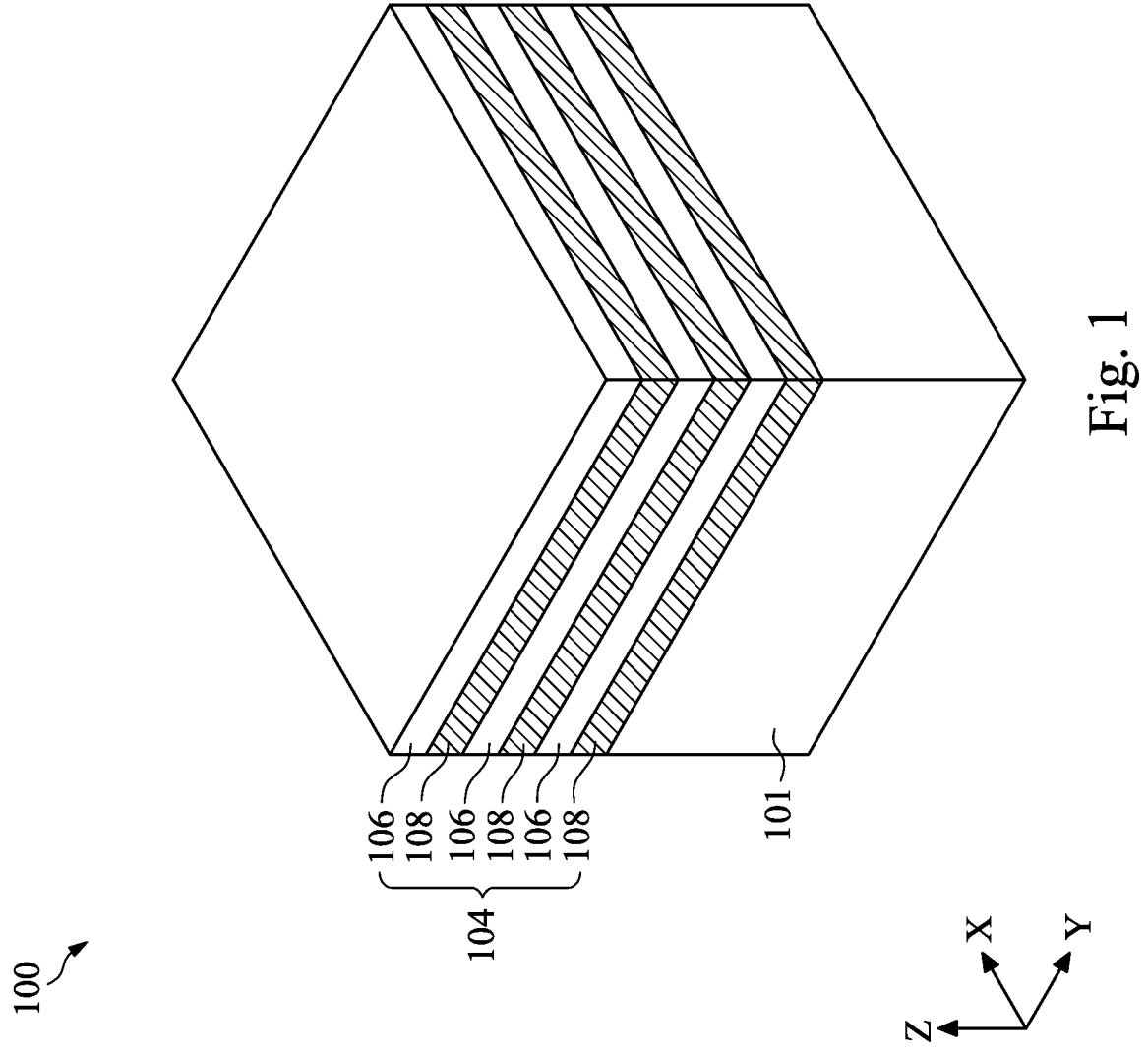
FIGS. 1-6 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanostructure channel FETs, such as gate all around (GAA) FETs, for example Horizontal Gate All Around (HGAA) FETs or Vertical Gate All Around (VGAA) FETs, implementations of some aspects of the present disclosure may be used in other processes and/or in other devices, such as planar FETs, Fin-FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-15C show exemplary processes for manufacturing a semiconductor device structure 100 according to embodiments of the present disclosure. It is understood that additional operations can be provided before, during, and after processes shown by FIGS. 1-15C, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2:
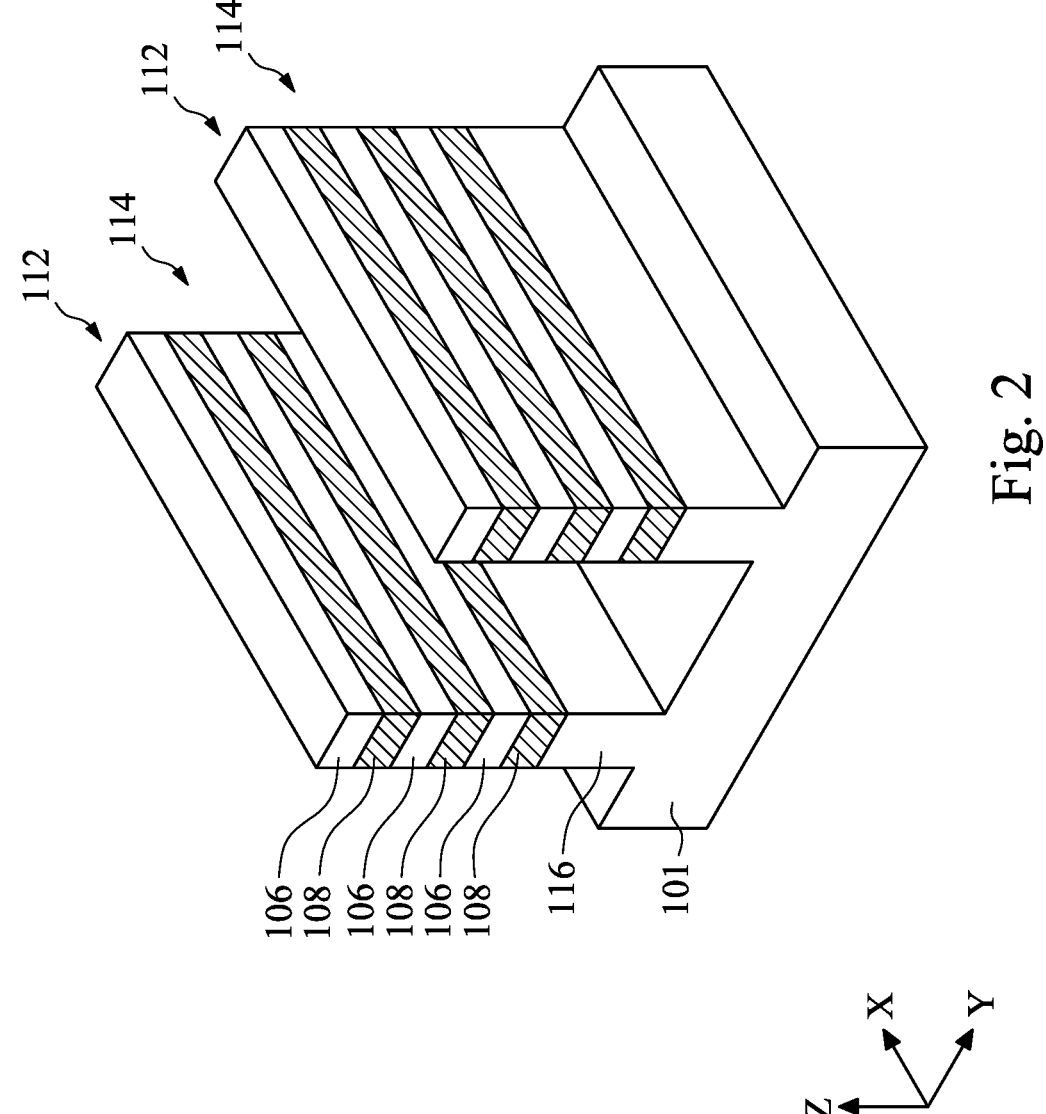

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
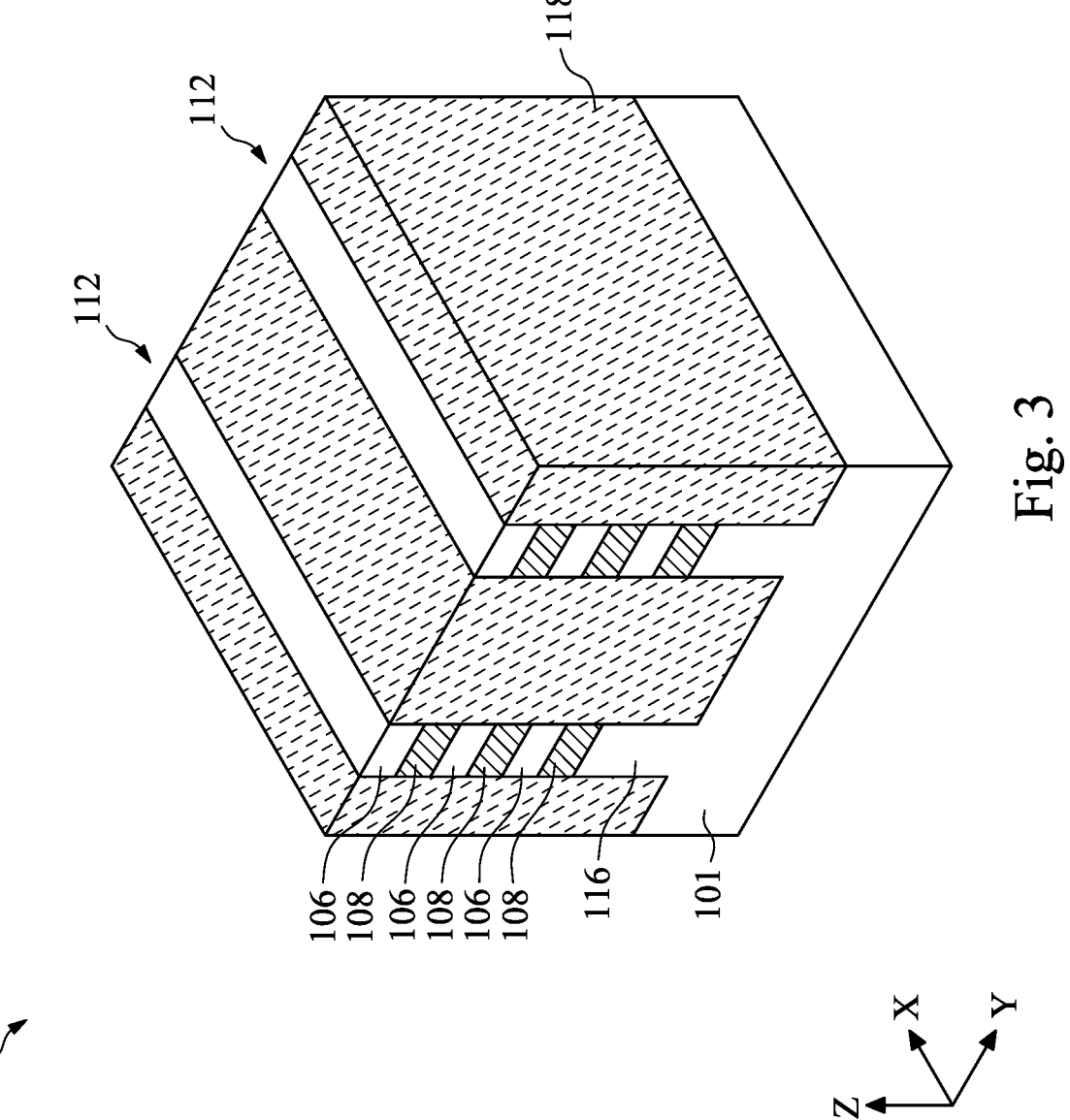

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
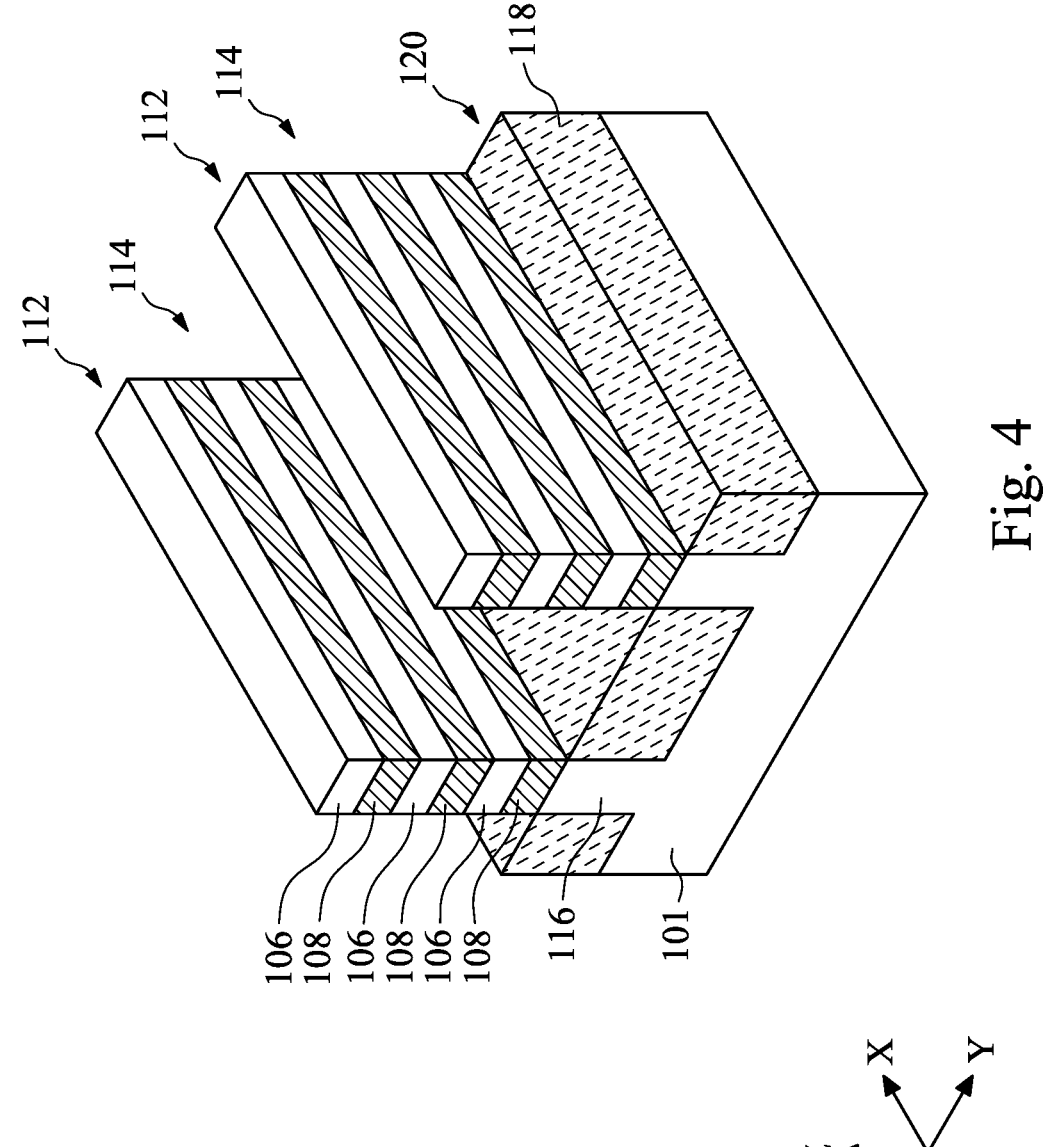

In FIG. 4, the insulating material 118 is recessed to form isolation regions 120. The recess of the insulating material 118 exposes portions of the fin structures 112, such as the stack of semiconductor layers 104. The recess of the insulating material 118 reveals the trenches 114 between the neighboring fin structures 112. The isolation regions 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101.

Figure 5:
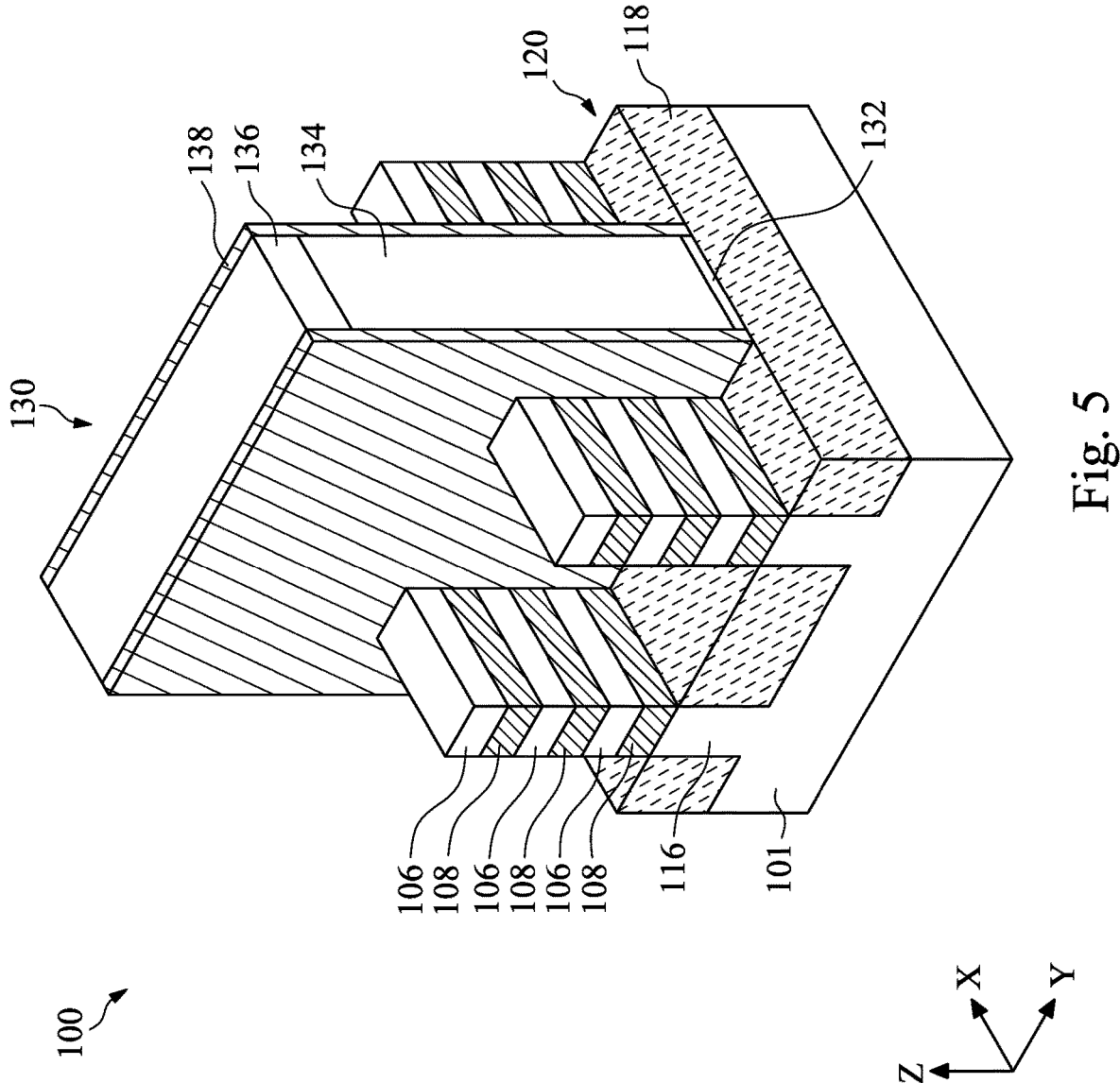

In FIG. 5, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. In some embodiments, the gate spacers 138 are also formed on sidewalls of the exposed portions of the fin structures 112. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100.

Figure 6:
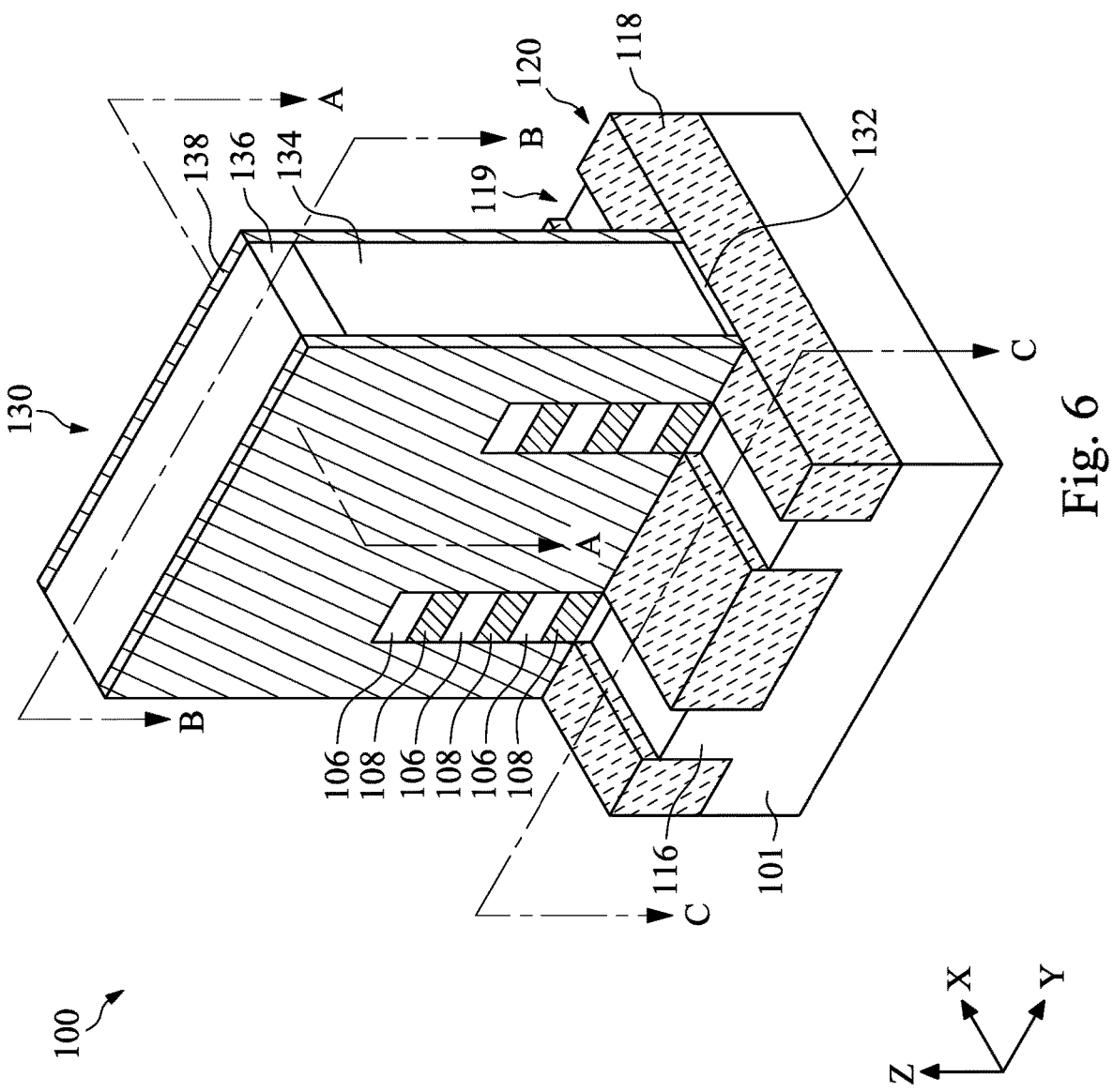

In FIG. 6, the portions of the fin structures 112 not covered by the sacrificial gate structure 130 and the gate spacers 138 are recessed to a level above, at, or below the top surfaces of the isolation regions 120. The recess of the portions of the fin structures 112 can be done by an etch process, either isotropic or anisotropic etch process, and the etch process may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide (NH₄OH), or any suitable etchant.

Figures 7A, 7B, 7C:
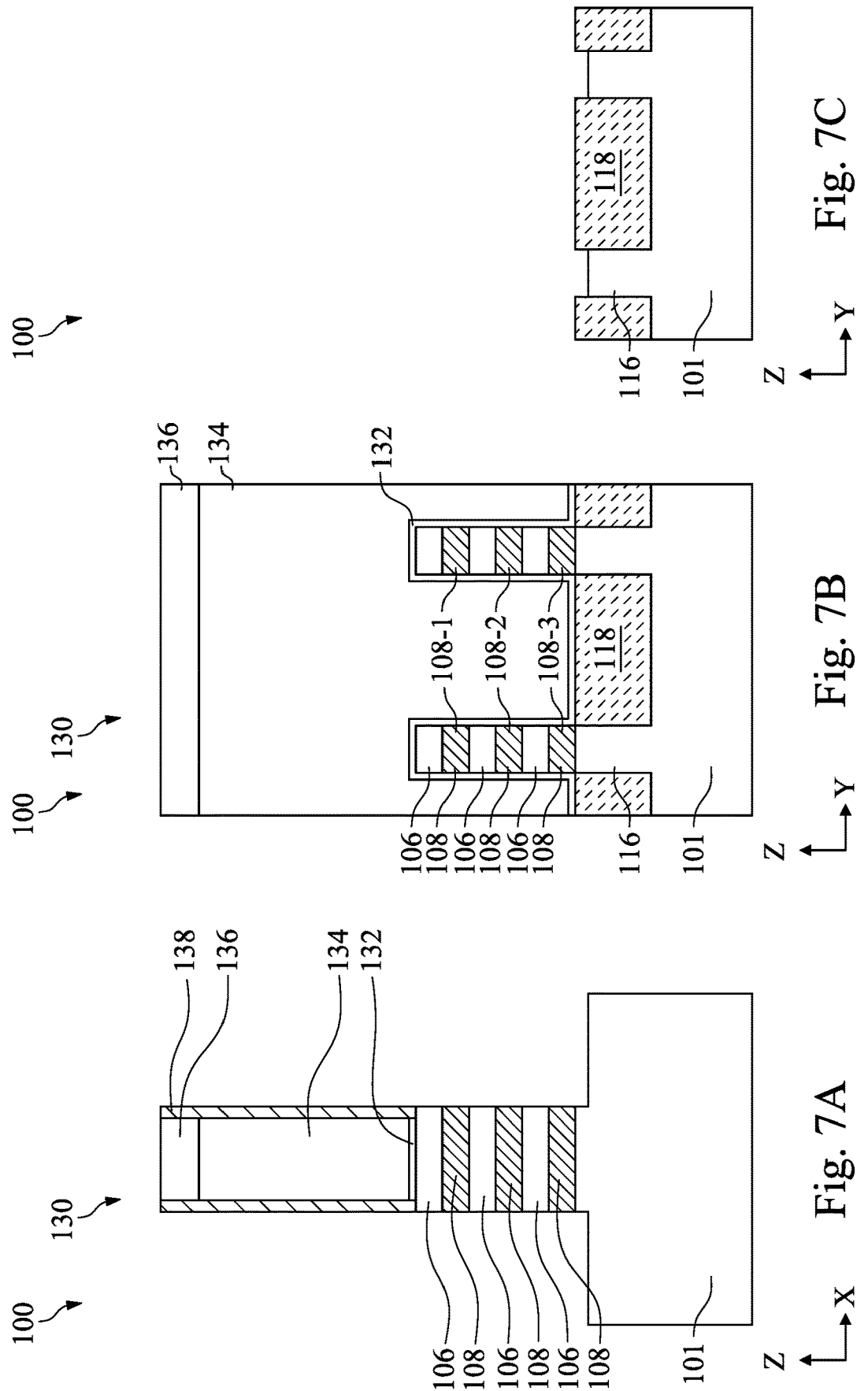

FIGS. 7A, 7B, and 7C are cross-sectional side views of the semiconductor device structure 100 taken along line A-A, line B-B, and line C-C of FIG. 6, respectively.

Figures 8A, 8B, 8C:
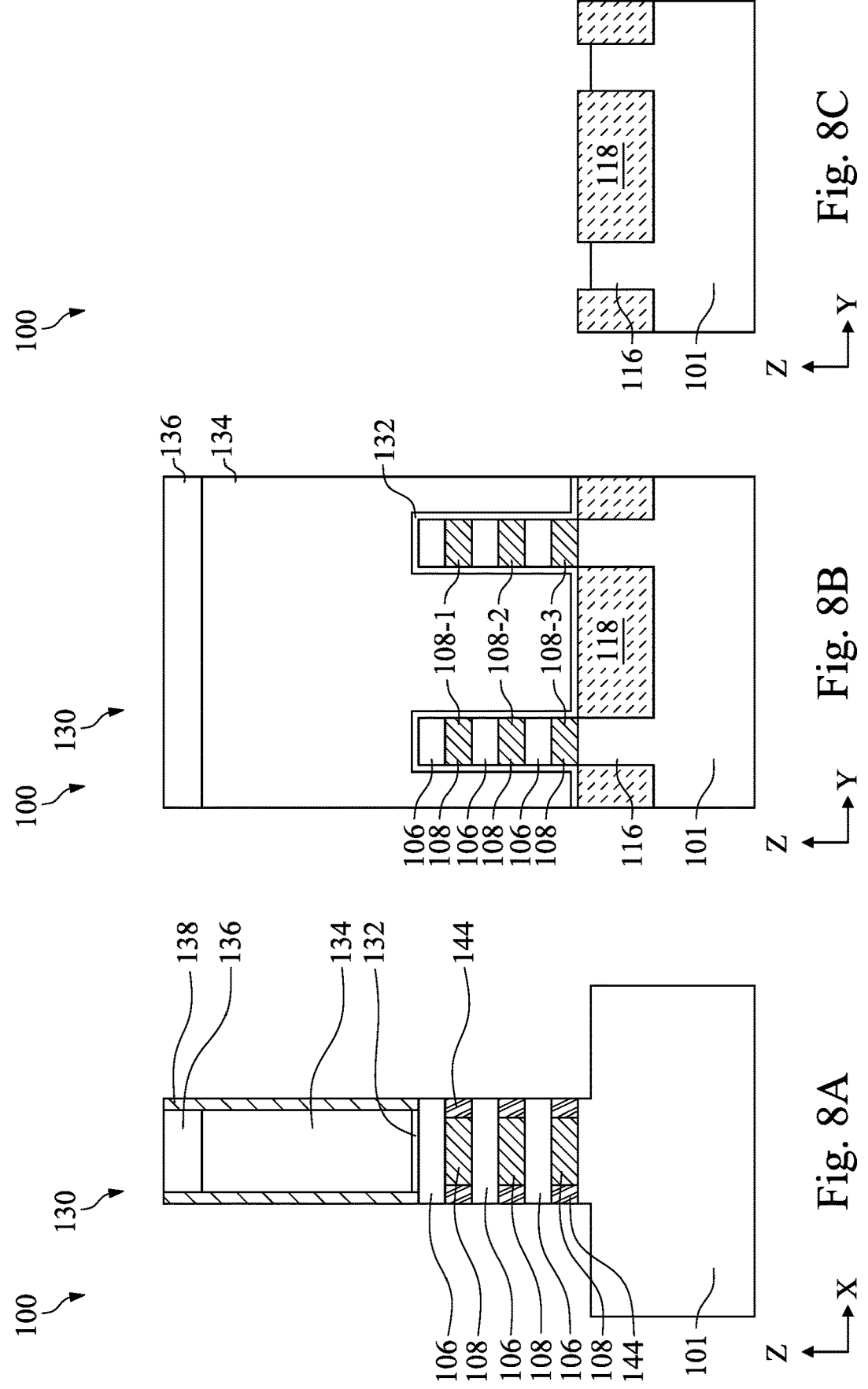

FIGS. 8A, 8B, and 8C are cross-sectional side views of one of various stages of manufacturing the semiconductor device structure 100 taken along line A-A, line B-B, and line C-C of FIG. 6, respectively, in accordance with some embodiments. As shown in FIG. 8A, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etch process. In cases where the second semiconductor layers 108 are made of SiGe and the first semiconductor layers 106 are made of silicon, the second semiconductor layer 108 can be selectively etched using a wet etchant such as, but not limited to, ammonium hydroxide (NH₄OH), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figures 9A, 9B, 9C:
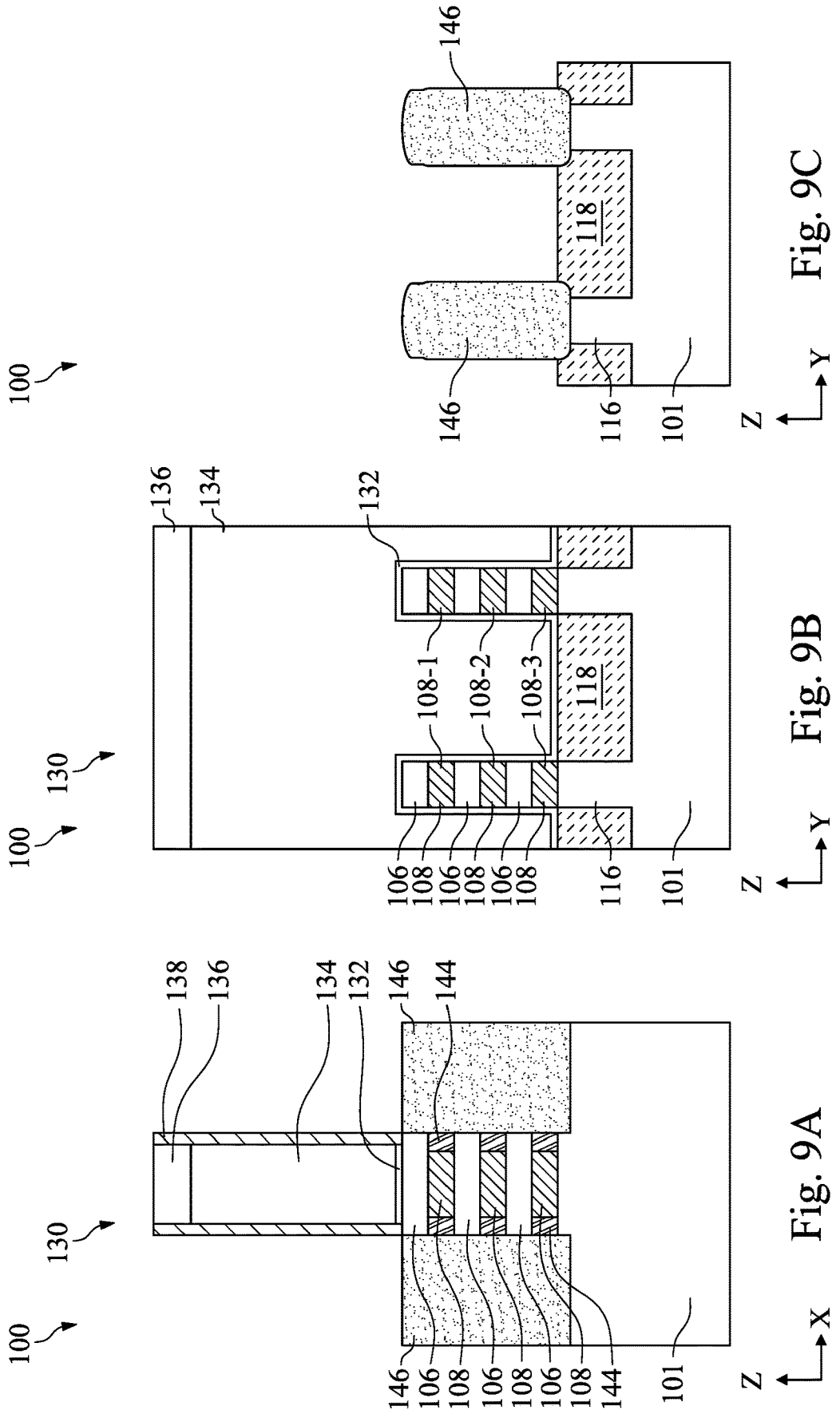

FIGS. 9A, 9B, and 9C are cross-sectional side views of one of various stages of manufacturing the semiconductor device structure 100 taken along line A-A, line B-B, and line C-C of FIG. 6, respectively, in accordance with some embodiments. As shown in FIGS. 9A and 9C, source/drain (S/D) regions 146 are formed from the well portion 116. The S/D regions 146 may grow both vertically and horizontally to form facets, which may correspond to crystalline planes of the material used for the well portion 116. In this disclosure, a source region and a drain region are interchangeably used, and the structures thereof are substantially the same. Furthermore, source/drain region(s) may refer to a source or a drain, individually or collectively dependent upon the context. The S/D regions 146 may be made of one or more layers of Si, SiP, SiC and SiCP for n-channel FETs or Si, SiGe, Ge for p-channel FETs. For p-channel FETs, p-type dopants, such as boron (B), may also be included in the S/D regions 146. The S/D regions 146 may be formed by an epitaxial growth method using CVD, ALD or MBE.

Figures 10A, 10B, 10C:
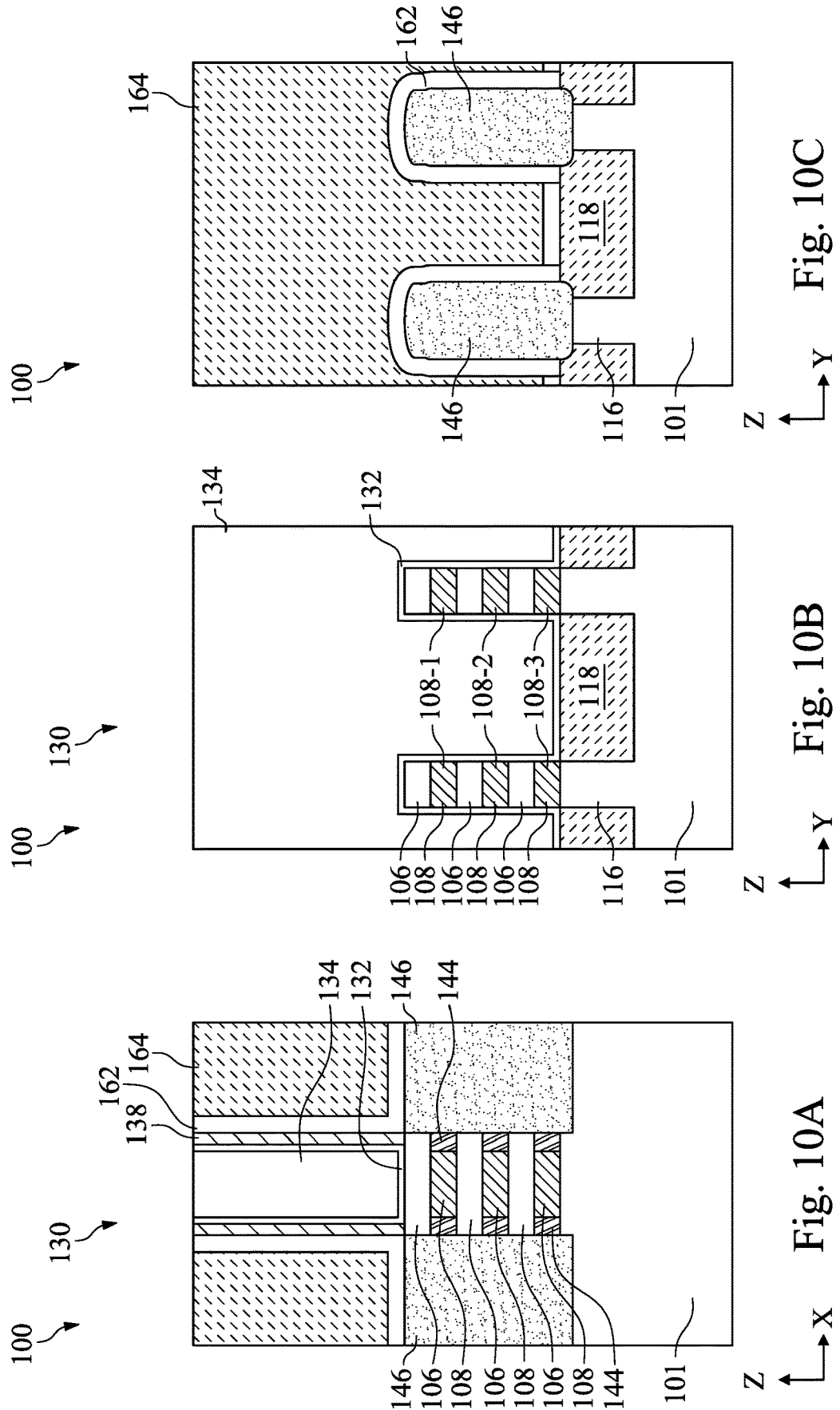

FIGS. 10A, 10B, and 10C are cross-sectional side views of one of various stages of manufacturing the semiconductor device structure 100 taken along line A-A, line B-B, and line C-C of FIG. 6, respectively, in accordance with some embodiments. In FIGS. 10A, 10B, and 10C, a contact etch stop layer (CESL) 162 is conformally formed on the exposed surfaces of the semiconductor device structure 100. The CESL 162 covers the sidewalls of the sacrificial gate structure 130, the insulating material 118, and the S/D regions 146. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include compounds including Si, O, C, and/or H, such as silicon oxide, SiCOH, or SiOC. Organic materials, such as polymers, may also be used for the ILD layer 164. The ILD layer 164 may be deposited by a PECVD process or other suitable deposition technique. In some embodiments, after formation of the ILD layer 164, the semiconductor device structure 100 may be subject to a thermal process to anneal the ILD layer 164.

After the ILD layer 164 is formed, a planarization operation, such as CMP, is performed on the semiconductor device structure 100 until the sacrificial gate electrode layer 134 is exposed, as shown in FIGS. 10A and 10B.

Figures 11A, 11B, 11C:
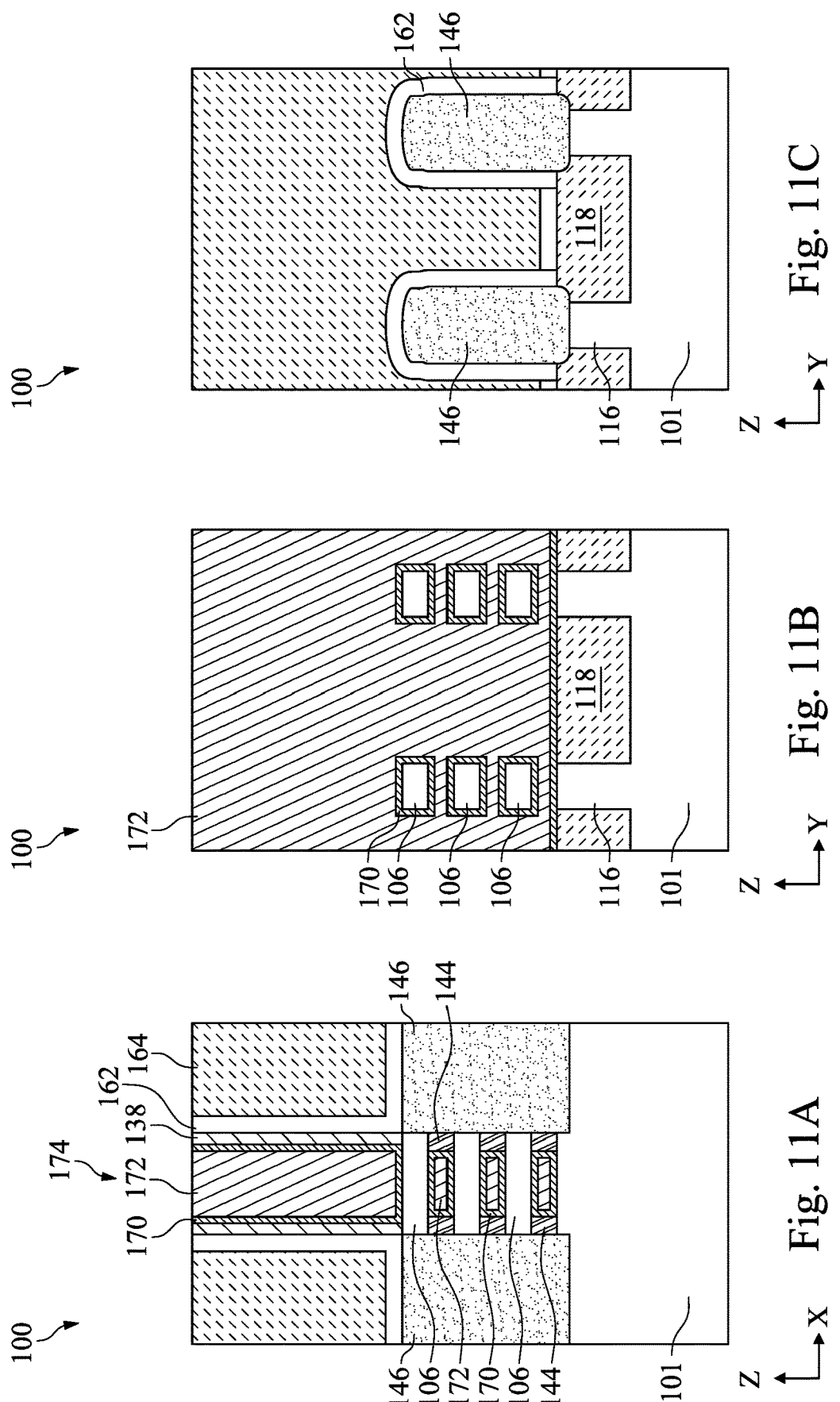

FIGS. 11A, 11B, and 11C are cross-sectional side views of one of various stages of manufacturing the semiconductor device structure 100 taken along line A-A, line B-B, and line C-C of FIG. 6, respectively, in accordance with some embodiments. As shown in FIGS. 11A and 11B, the sacrificial gate structure 130 and the second semiconductor layers 108 are removed. The removal of the sacrificial gate structure 130 and the semiconductor layers 108 forms an opening between gate spacers 138 and between first semiconductor layers 106. The ILD layer 164 protects the S/D regions 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the ILD layer 164, and the CESL 162.

Portions of the second semiconductor layers 108 may be removed using a selective wet etching process. In cases where the second semiconductor layers 108 are made of SiGe and the first semiconductor layers 106 are made of Si, the chemistry used in the selective wet etching process removes the SiGe while not substantially affecting Si, the dielectric materials of the gate spacers 138, and the dielectric spacers 144. In one embodiment, the second semiconductor layers 108 can be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants.

After the formation of the nanostructure channels (i.e., the exposed portions of the first semiconductor layers 106), a gate dielectric layer 170 is formed to surround the exposed portions of the first semiconductor layers 106, and a gate electrode layer 172 is formed on the gate dielectric layer 170. The gate dielectric layer 170 and the gate electrode layer 172 may be collectively referred to as a gate structure 174. In some embodiments, an interfacial layer (IL) (not shown) is formed between the gate dielectric layer 170 and the exposed surfaces of the first semiconductor layers 106. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate electrode layer 172 may be also deposited over the upper surface of the ILD layer 164. The gate dielectric layer 170 and the gate electrode layer 172 formed over the ILD layer 164 are then removed by using, for example, CMP, until the top surface of the ILD layer 164 is exposed.

Figure 12A:
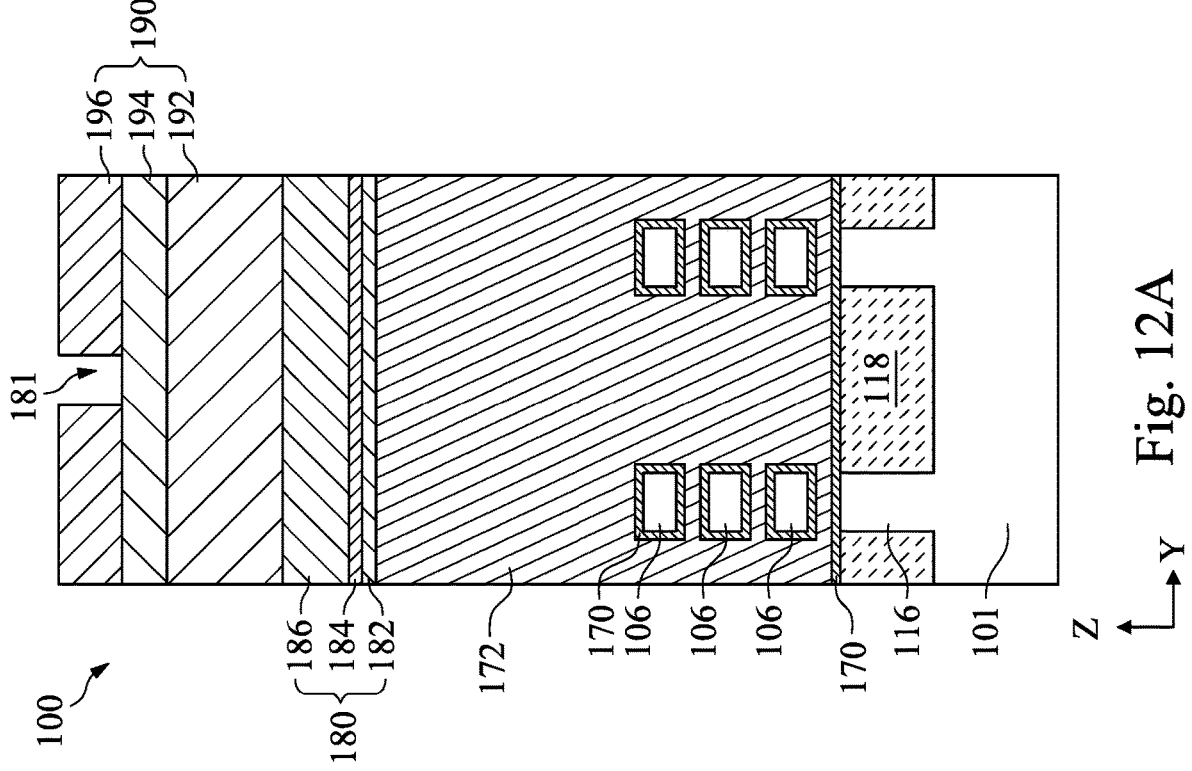
FIGS. 12A-12D are cross-sectional side views of various stages of manufacturing the semiconductor device structure taken along line B-B of FIG. 6, in accordance with some embodiments.

FIGS. 12A-12D are cross-sectional side views of various stages of manufacturing the semiconductor device structure 100 taken along line B-B of FIG. 6, in accordance with some embodiments. As shown in FIG. 12A, a mask structure 180 is formed on the gate electrode layer 172 and the ILD layer 164, and a resist structure 190 is formed on the mask structure 180. In some embodiments, the mask structure 180 includes a first dielectric layer 182, a semiconductor layer 184 deposited on the first dielectric layer, and a second dielectric layer 186 deposited on the semiconductor layer 184. The first and second dielectric layers 182, 186 may include any suitable dielectric material. In some embodiments, the first and second dielectric layers 182, 186 are SiN layers. The semiconductor layer 184 may be any suitable semiconductor layer. In some embodiments, the semiconductor layer 184 is an amorphous silicon layer. In some embodiments, the resist structure 190 is a tri-layer photoresist. For example, the resist structure 190 may include a bottom layer 192 deposited on the mask structure 180, a middle layer 194 deposited on the bottom layer 192, and a photoresist layer 196 deposited on the middle layer 194. The bottom layer 192 and the middle layer 194 are made of different materials such that the optical properties and/or etching properties of the bottom layer 192 and the middle layer 194 are different from each other. In some embodiments, the bottom layer 192 may be a carbon layer, and the middle layer 194 may be a silicon-rich layer designed to provide an etch selectivity between the middle layer 194 and the bottom layer 192. The photoresist layer 196 may be a chemically amplified photoresist layer and can be a positive tone photoresist or a negative tone photoresist. The photoresist layer 196 may include a polymer, such as phenol formaldehyde resin, a poly (norbornene)-co-malaic anhydride (COMA) polymer, a poly(4-hydroxystyrene) (PHS) polymer, a phenol-formaldehyde (bakelite) polymer, a polyethylene (PE) polymer, a polypropylene (PP) polymer, a polycarbonate polymer, a polyester polymer, or an acrylate-based polymer, such as a poly (methyl methacrylate) (PMMA) polymer or poly (methacrylic acid) (PMAA). The photoresist layer 196 may be formed by spin-on coating. The photoresist layer 196 may be patterned to have an opening 181 formed therein.

Figure 12B:
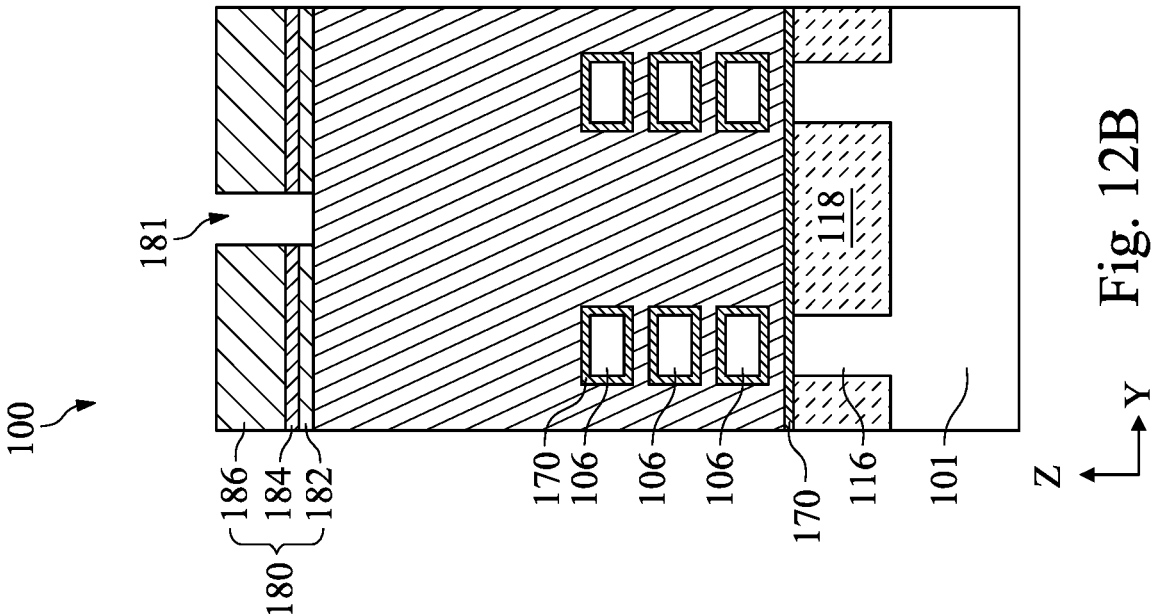

As shown in FIG. 12B, the opening 181 is extended into the middle layer 194, the bottom layer 192, and the mask structure 180. The opening 181 may be extended into the middle layer 194, the bottom layer 192, and the mask structure 180 by one or more etch processes. In some embodiments, the resist structure 190 is removed during the one or more etch processes to extend the opening 181 into the mask structure 180. In some embodiments, the resist structure 190 is removed after the opening 181 is extended into the mask structure 180. A portion of the gate electrode layer 172 is exposed in opening 181.

Figure 12C:
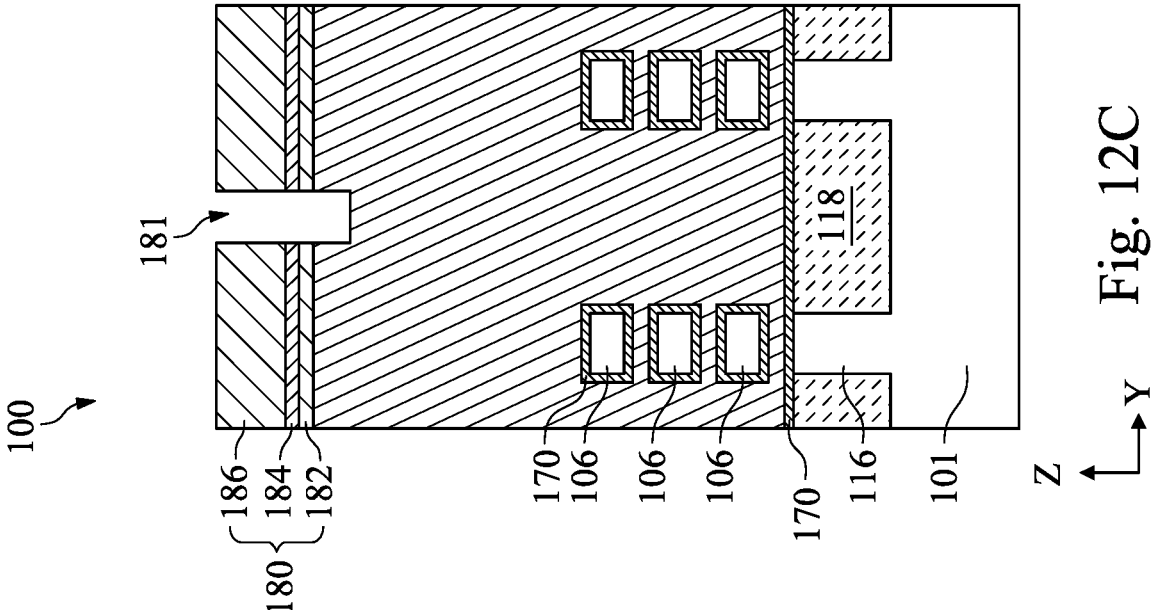
Figure 12D:
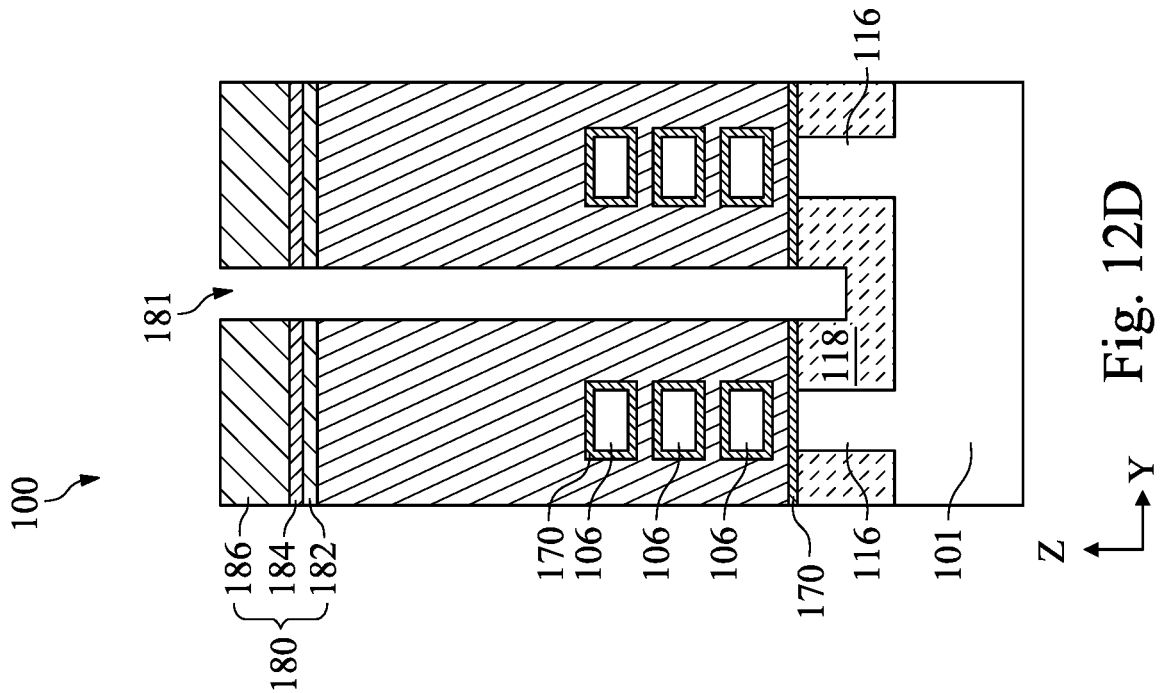

As shown in FIGS. 12C and 12D, the exposed portion of the gate electrode layer 172 is removed. The exposed portion of the gate electrode layer 172 may be removed by any suitable method. In some embodiments, a cyclic process is performed to remove the exposed portion of the gate electrode layer 172. The cyclic process includes a plurality of cycles, and each cycle includes depositing a layer on the exposed portion of the gate electrode layer 172, oxidizing the layer to form an oxide layer, removing portions of the oxide layer, and removing a portion of the exposed portion of the gate electrode layer 172. In some embodiments, the layer may be a silicon-containing layer and may be formed by any suitable process, such as CVD or PECVD. A silicon-containing precursor, such as $SiCl_4$, may be introduced into the processing chamber in which the semiconductor device structure 100 is disposed therein, and the silicon-containing layer is formed on the exposed surfaces of the semiconductor device structure 100. In some embodiments, the silicon-containing layer is formed on the second dielectric layer 186, the sidewalls of the first dielectric layer 182, the semiconductor layer 184, and the second dielectric layer 186 in the opening 181, and the exposed surface of the gate electrode layer 172. Next, the oxidation process is performed to oxidize the silicon-containing layer to form the oxide layer, such as a silicon oxide layer. The oxidation process may be any suitable oxidation process, such as a thermal oxidation process. Next, a breakthrough etch process is performed to remove portions of the oxide layer formed on horizontal surfaces of the semiconductor device structure 100, such as the portions of the oxide layer formed on the second dielectric layer 186 and the exposed surface of the gate electrode layer 172. The breakthrough etch process may be an anisotropic dry etch process, such as a plasma etch process. In some embodiments, a fluorine-containing etchant, such as $C_4F_6$, may be used in the anisotropic dry etch process. After the breakthrough etch process, the portion of the gate electrode layer 172 located at the bottom of the opening 181 is exposed, and a main etch process is performed to remove a portion of the gate electrode layer 172. In some embodiments, the main etch process is a dry etch process, such as an anisotropic plasma etch process. One of more etchants may be used in the main etch process. In some embodiments, one or more chlorine-containing etchants, such as $BCl_3$ and/or $Cl_2$, may be used. For example, $BCl_3$ and $Cl_2$ are simultaneously introduced into the processing chamber in which the semiconductor device structure 100 is disposed. $BCl_3$ etches dielectrics at a substantially faster rate than metals, while $Cl_2$ etches metals at a substantially faster rate than dielectrics. In some embodiments, the $BCl_3$ is introduced into the processing chamber at a first flow rate, the $Cl_2$ is introduced into the processing chamber at a second flow rate, and the first flow rate is substantially less than the second flow rate. A ratio of the first flow rate to the second flow rate may range from about 1:2 to about 1:6. Thus, the gate electrode layer 172 is etched at a substantially faster rate than the gate dielectric layer 170. The oxide layer formed on the sidewalls in the opening 181 may be also removed by the one or more chlorine-containing etchants. In some embodiments, a deposition gas, such as a silicon-containing gas, for example $SiCl_4$, may be introduced into the processing chamber along with the etchants. The deposition gas may form a layer on sidewalls of the gate electrode layer 172 in the opening 181 as the opening 181 extends into the gate electrode layer 172. The layer protects the sidewalls of the gate electrode layer 172 during the main etch process to protect the sidewalls of the gate electrode layer 172. In other words, the oxide layer formed on the sidewalls in the opening 181 may be removed by the etchants of the main etch process, while the deposition gas of the main etch process forms the layer, which may be a silicon layer, on the sidewalls in the opening 181. In some embodiments, the time duration of the main etch process may be substantially short, such as from about 10 seconds to about 20 seconds, and a small portion of the gate electrode layer 172 is removed, as shown in FIG. 12C.

The cycle of depositing a layer on the exposed portion of the gate electrode layer 172, oxidizing the layer to form an oxide layer, removing portions of the oxide layer, and removing a portion of the exposed portion of the gate electrode layer 172 is repeated multiple times so the opening 181 extends through the gate electrode layer 172 and into the insulating material 118, as shown in FIG. 12D. After the opening 181 is first extended into the gate electrode layer 172, as shown in FIG. 12C, the depositing a layer on the exposed portion of the gate electrode layer 172, oxidizing the layer to form an oxide layer, and removing portions of the oxide layer of the cyclic process form the oxide layer on the sidewalls of the gate electrode layer 172 in the opening 181 to protect the sidewalls of the gate electrode layer 172. In some embodiments, the number of cycles ranges from about eight to about 15, such as 12. In some embodiments, one or more wet clean processes may be performed in between the plurality of cycles to remove byproducts formed from the etching processes. For example, in some embodiments, after seven cycles, a wet clean process is performed. The wet clean process does not substantially affect the materials of the semiconductor device structure 100, such as the gate electrode layer 172 and the gate dielectric layer 170.

Figures 13A, 13B:
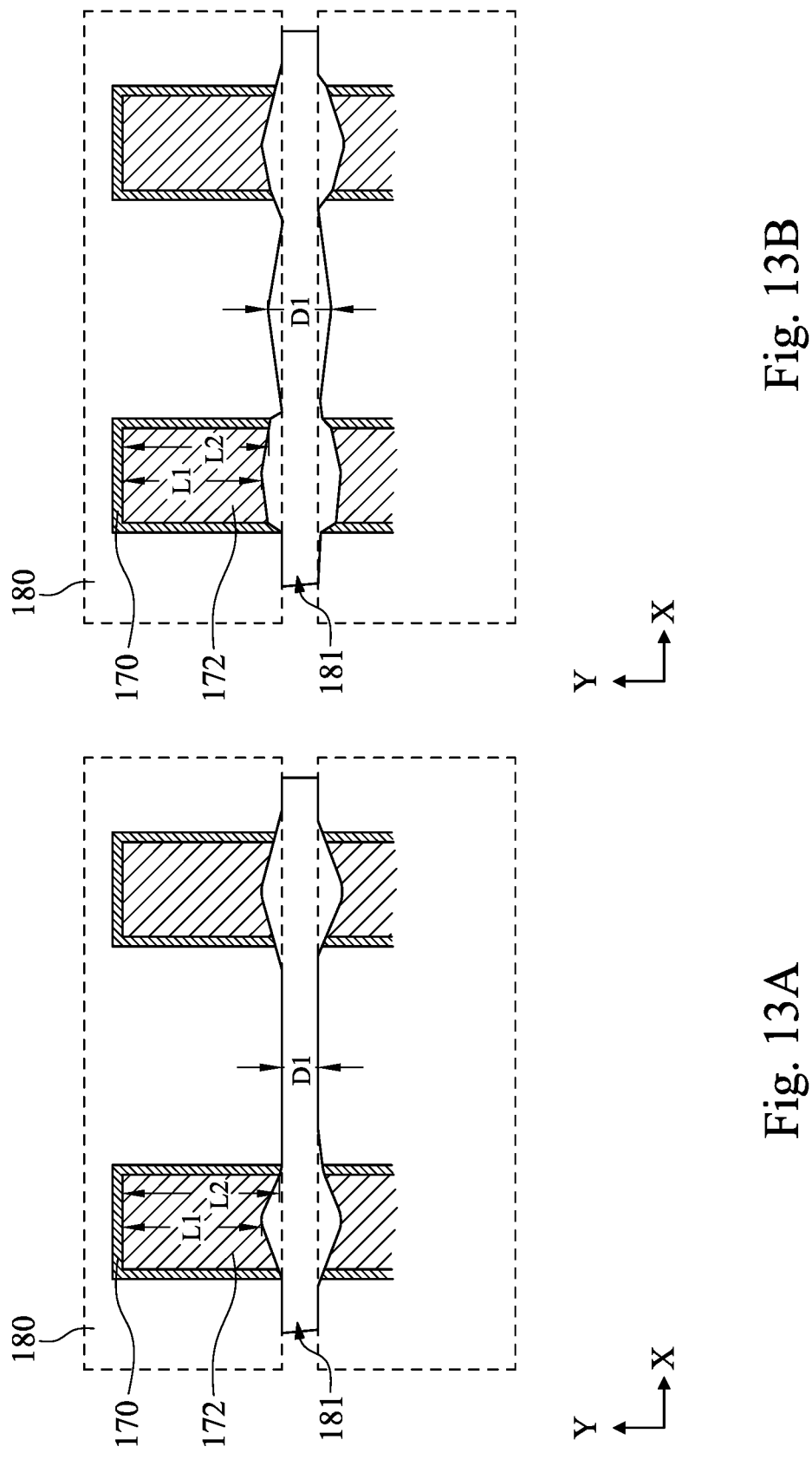
FIGS. 13A and 13B are top views of various stages of forming an opening in a gate electrode layer of the semiconductor device structure, in accordance with some embodiments.

FIGS. 13A and 13B are top views of various stages of forming the opening 181 in the gate electrode layer 172 of the semiconductor device structure 100, in accordance with some embodiments. Various components of the semiconductor device structure 100, such as the CESL 162, the ILD layer 164, and the gate spacers 138 are omitted in FIGS. 13A and 13B for clarity. As shown in FIG. 13A, the opening 181 may extend across one or more gate electrode layers 172, such as two gate electrode layers 172. The opening 181 may be also formed in the ILD layer 164 between the adjacent gate electrode layers 172. After performing the cyclic process to extend the opening 181 through the gate electrode layer 172 and into the insulating material 118, the opening 181 may extend under the mask structure 180 (shown in dotted lines for better illustration), as shown in FIG. 13A. In other words, lateral undercut of the gate electrode layer 172 below the mask structure 180 may occur. One of the reasons for the lateral undercut is that the etch rate of the gate electrode layer 172 is substantially faster than the etch rate of the gate dielectric layer 170. In addition, portions of the gate electrode layer 172 in contact with the gate dielectric layer 170 are also etched at a slower rate compared to the portions of the gate electrode layer 172 located away from the gate dielectric layer 170. In some embodiments, the gate electrode layer 172 includes a center portion having a length L1 and an edge portion having a length L2, and the length L2 is substantially greater than the length L1. With the length L2 adjacent a subsequently formed conductive feature 193 (FIG. 15A), the effective capacitance (Ceff) may be increased. With the increased Ceff, a decrease in speed of devices such as ring oscillator and a decrease in AC device performance may occur.

In some embodiments, in order to reduce the length L2 without substantially affecting the length L1, an additional etch process may be performed after the cyclic process that extended the opening 181 into the insulating material 118. The additional etch process may utilize one or more etchants that etch dielectrics at a substantially faster rate than metals. As a result, the additional etch process etches the gate dielectric layer 170 at a substantially faster rate than the gate electrode layer 172. Furthermore, the portion of the gate electrode layer 172 in contact with the gate dielectric layer 170 may be etched at a faster rate than the portion of the gate electrode layer 172 located away from the gate dielectric layer 170. The opening 181 after the additional etch process is shown in FIG. 13B. As shown in FIG. 13B, the difference between the length L1 and L2 is reduced substantially. In some embodiments, the length L1 and the length L2 are substantially the same. With the reduced length L2 of the edge portion of the gate electrode layer 172, the Ceff is reduced.

In some embodiments, lateral undercut of the ILD layer 164 (FIG. 11A) below the mask structure 180 may occur as a result of the additional etch process, because the additional etch process removes dielectrics at a faster rate. Thus, in some embodiments, the dimension D1 of the opening 181 along the Y direction in the ILD layer 164 may be substantially constant after the cyclic process and before the additional etch process, and the dimension D1 varies after the additional etch process, as shown in FIGS. 13A and 13B. As shown in FIG. 13B, after the additional etch process, the portion of the opening 181 located in the ILD layer 164 between adjacent gate electrode layers 172 may have the dimension D1 that increases from the gate electrode layer 172 to a midpoint between the adjacent gate electrode layers 172. In other words, the dimension D1 increases in a direction away from a first gate electrode layer 172, and at about the midpoint between the first gate electrode layer 172 and a second gate electrode layer 172 adjacent the first gate electrode layer 172, the dimension D1 decreases in the direction towards the second gate electrode layer 172. In some embodiments, the dimension D1 has a maximum value at about the midpoint between the first and second gate electrodes 172, as shown in FIG. 13B.

In some embodiments, the additional etch process is an isotropic plasma etch process that utilizes one or more chlorine-containing etchants. For example, $BCl_3$ and $Cl_2$ are simultaneously introduced into the processing chamber in which the semiconductor device structure 100 is disposed. As described above, $BCl_3$ etches dielectrics at a substantially faster rate than metals, while $Cl_2$ etches metals at a substantially faster rate than dielectrics. In some embodiments, the $BCl_3$ is introduced into the processing chamber at a first flow rate, the $Cl_2$ is introduced into the processing chamber at a second flow rate, and the first flow rate is substantially greater than the second flow rate. A ratio of the first flow rate to the second flow rate may range from about 5:1 to about 15:1, such as about 8:1 to about 12:1, for example 10:1. In some embodiments, the first flow rate ranges from about 250 standard cubic centimeter per minute (sccm) to about 350 sccm, such as about 300 sccm, and the second flow rate ranges from about 25 sccm to about 35 sccm, such as about 30 sccm. In some embodiments, the time duration of the additional etch process may be substantially longer than the time duration of one cycle of the cyclic process, because the etchant that etches metals at a faster rate has a substantially slower flow rate. For example, the time duration of the additional etch process may be about twice as long as the time duration of one cycle of the cyclic process. Furthermore, no deposition gas is introduced into the processing chamber along with the etchants during the isotropic plasma etch process. In some embodiments, the chamber pressure of the isotropic plasma etch process is less than about 100 mTorr, such as from about 50 mTorr to about 90 mTorr. The isotropic plasma etch process may utilize transformer coupled plasma (TCP) with a plasma power ranging from about 1000 W to about 1500 W, such as about 1200 W. The transformer-coupled capacitance tuning (TCCT) ratio may be about 1.5. A bias voltage of about 50 V to about 150 V, such as about 100 V, at about 13 MHz may be applied. The plasma power may be pulsed with a duty cycle ranging from about 20 percent to about 80 percent and a duty cycle frequency of about 50 Hz to about 100 Hz, such as about 100 Hz. The duration of the additional etch process may range from about 20 seconds to about 40 seconds, such as about 30 seconds.

In some embodiments, the additional etch process is a wet etch process due to its generally isotropic nature. In some embodiments, the wet etch process utilizes a fluorine-containing etchant, such as HF solution. In some embodiments, the additional etch process is performed after the completion of the cyclic process that extended the opening 181 through the gate electrode layer 172. If the additional etch process is performed between cycles of the cyclic process or before the cyclic process, the undercut of the gate electrode layer 172 and the ILD layer 164 below the mask structure 180 may be worse by the subsequently performed cycles of the cyclic process.

After the additional etch process, an optional trim process may be performed to trim the mask structure 180, so the opening 181 in the mask structure 180 is widened. In some embodiments, a plasma etch process is performed to trim the mask structure 180. The plasma etch process may utilize a fluorine-containing etchant, such as $C_4F_6$. After the optional trim process, a wet clean process may be performed to remove any byproducts from the etch processes.

Figures 14A, 14B, 14C:
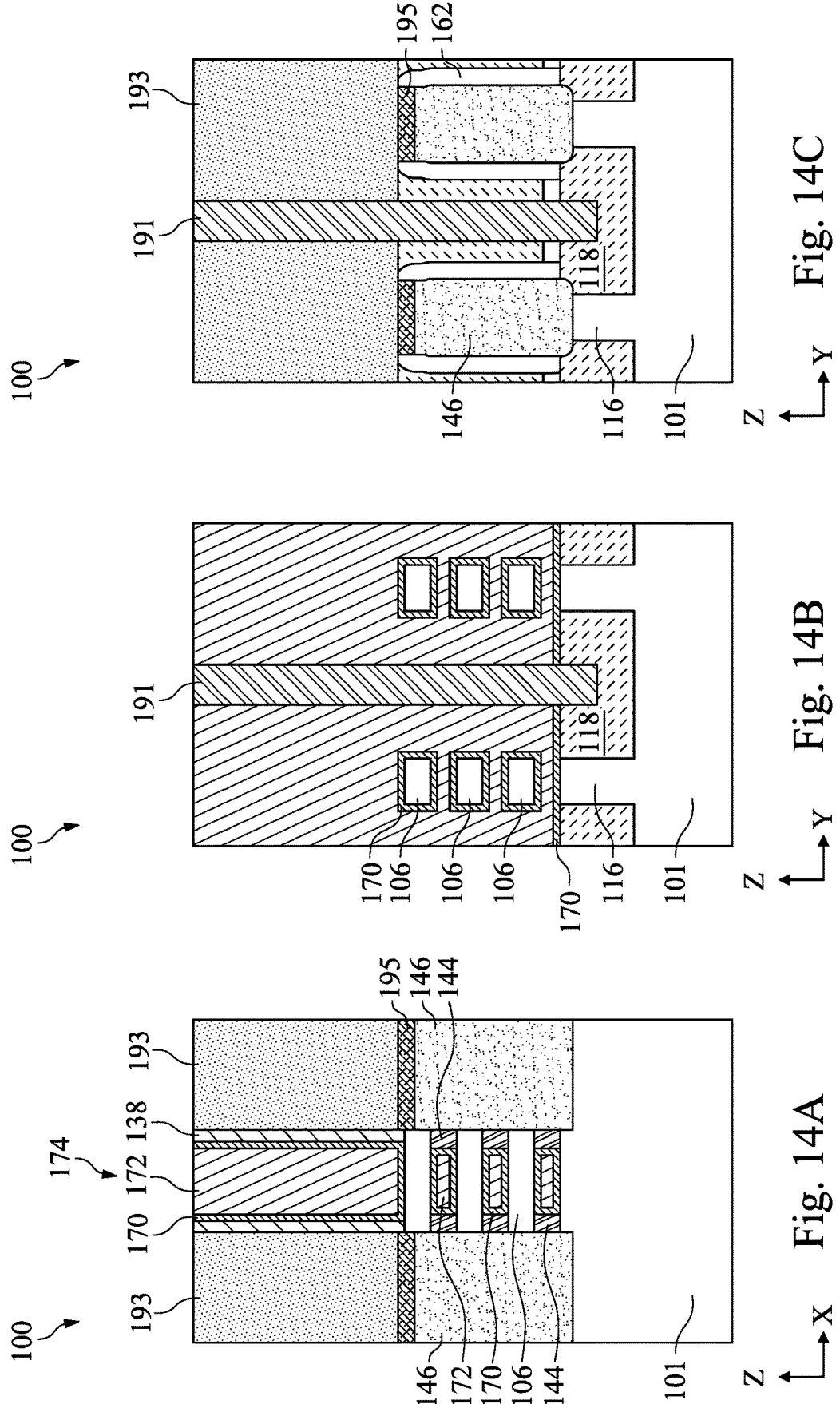
FIGS. 14A-14C are various views of one of various stages of manufacturing the semiconductor device structure, in accordance with some embodiments.

FIGS. 14A-14C are various views of one of various stages of manufacturing the semiconductor device structure 100, in accordance with some embodiments. As shown in FIGS. 14A-14C, a dielectric material 191 is formed in the opening 181, the mask structure 180 is removed, and conductive features 193 are formed in the ILD layer 164. Silicide layers 195 may be formed between S/D regions 146 and the conductive feature 193. The dielectric material 191 may include any suitable dielectric material, such as SiN. The conductive feature 193 may include any suitable electrically conductive material, such as a metal. The silicide layer 195 may be a metal silicide layer that is a result of a reaction between the metal of the conductive feature 193 and the semiconductor material of the S/D region 146.

Figure 15A:
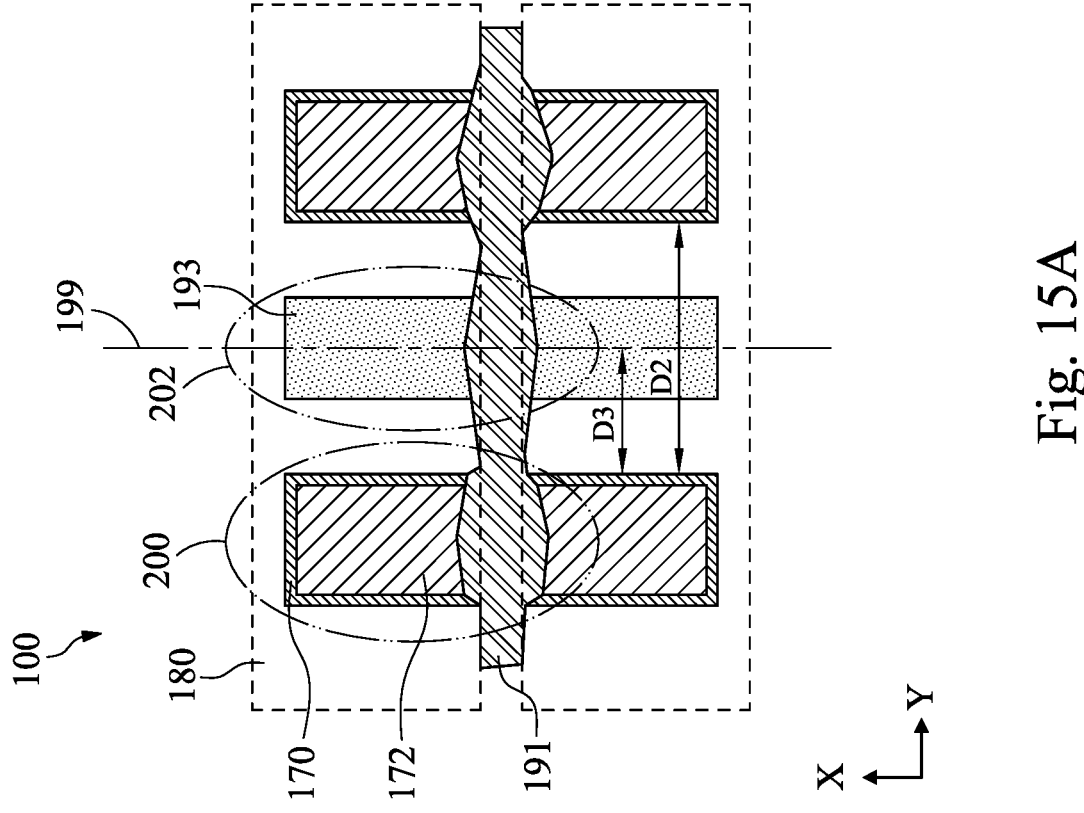
FIGS. 15A-15C are top views of the semiconductor device structure of FIGS. 14A-14C, in accordance with some embodiments.
Figure 15C:
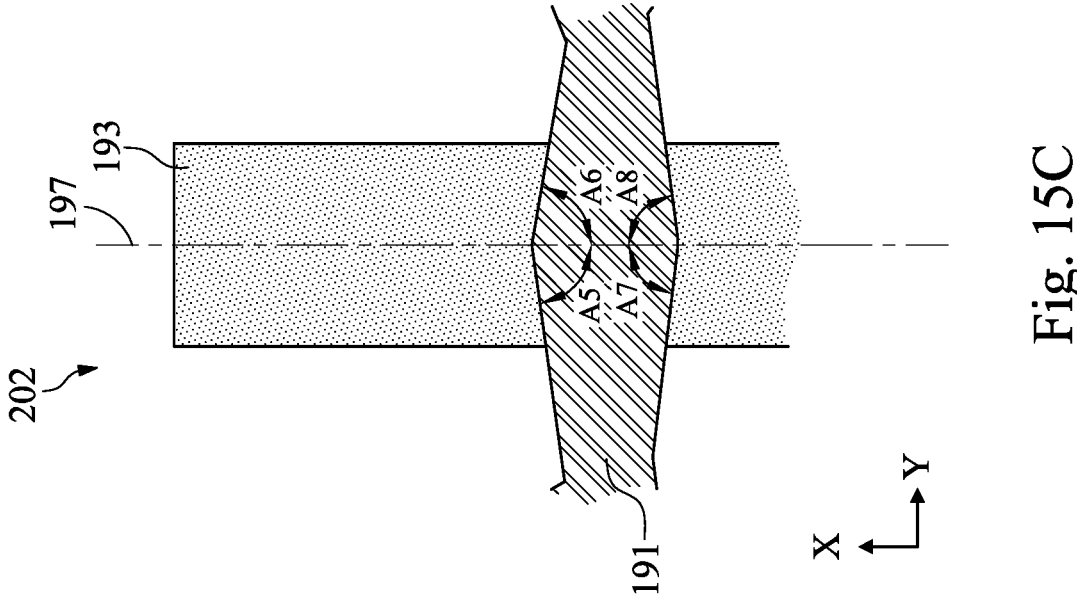
Figure 15B:
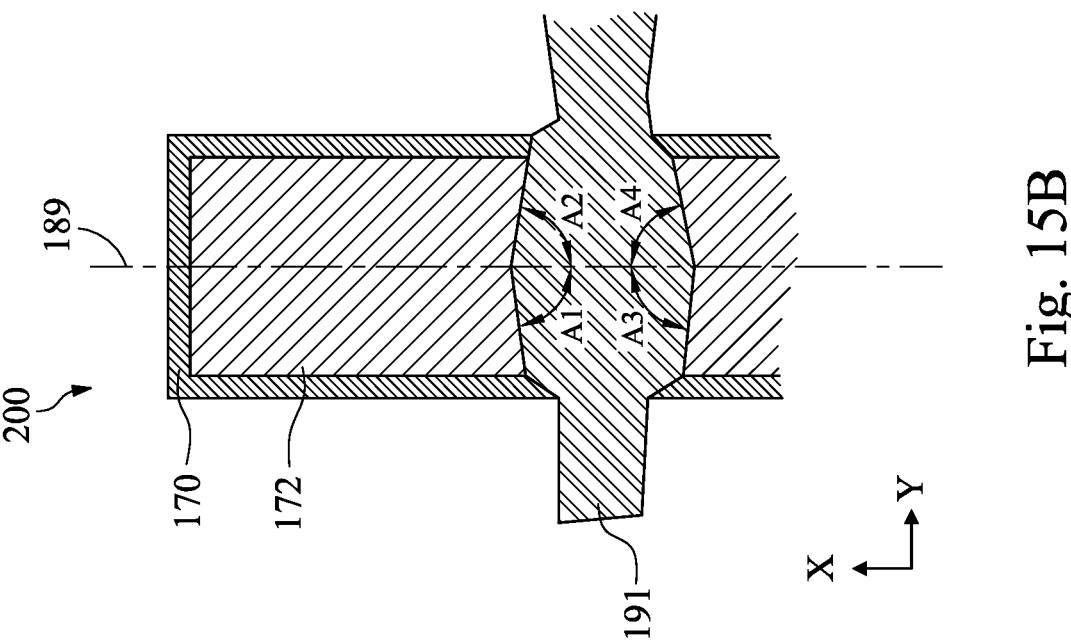

FIGS. 15A-15C are top views of the semiconductor device structure 100 of FIGS. 14A-14C, in accordance with some embodiments. As shown in FIG. 15A, the dielectric material 191 is formed in the opening 181 (FIG. 13A), and the dielectric material 191 may have the shape of the opening 181. In some embodiments, a distance D2 between adjacent gate electrode layers 172 may range from about 72 nm to about 82 nm. A distance D3 between the gate electrode layer 172 to a midpoint 199 between the adjacent gate electrode layers 172 may range from about 36 nm to about 41 nm. FIG. 15B illustrates an enlarged portion 200 of FIG. 15A, and FIG. 15C illustrates an enlarged portion 202 of FIG. 15A. As shown in FIG. 15B, the dielectric material 191 includes a first angle A1 formed between a first surface of the dielectric material 191 extending from a midpoint 189 of the gate electrode layer 172 to a first sidewall of the gate electrode layer 172 and a longitudinal axis of the gate electrode layer 172, a second angle A2 formed between a second surface of the dielectric material 191 extending from the midpoint 189 of the gate electrode layer 172 to a second sidewall of the gate electrode layer 172 opposite the first sidewall and the longitudinal axis of the gate electrode layer 172, a third angle A3 formed between a third surface of the dielectric material 191 opposite the first surface, and a fourth angle A4 formed between a fourth surface of the dielectric material 191 opposite the second surface. In some embodiments, as a result of the additional etch process, the angles A1, A2, A3, and A4 are substantially greater than about 70 degrees, such as greater than about 75 degrees. In some embodiments, the angles A1, A2, A3, A4 range from about 74 degrees to about 80 degrees.

As shown in FIG. 15C, the dielectric material 191 includes a fifth angle A5 formed between a fifth surface of the dielectric material 191 extending from a midpoint 197 of the conductive feature 193 to a first sidewall of the conductive feature 193 and a longitudinal axis of the conductive feature 193, a sixth angle A6 formed between a sixth surface of the dielectric material 191 extending from the midpoint 197 of the conductive feature 193 to a second sidewall of the conductive feature 193 opposite the first sidewall and the longitudinal axis of the conductive feature 193, a seventh angle A7 formed between a seventh surface of the dielectric material 191 opposite the fifth surface, and an eighth angle A8 formed between an eighth surface of the dielectric material 191 opposite the sixth surface. In some embodiments, as a result of the additional etch process, the angles A5, A6, A7, and A8 are substantially less than about 90 degrees, such as from about 78 degrees to about 81 degrees.

Embodiments of the present disclosure provide a method to form a semiconductor device structure 100. The method includes forming an opening through a gate electrode layer 172 by a cyclic process and performing an additional etch process to remove edge portions of the gate electrode layer 172. Some embodiments may achieve advantages. For example, with the reduced length L2 of the edge portion of the gate electrode layer 172 being adjacent a conductive feature 193, the Ceff is reduced.

An embodiment is a method. The method includes forming a fin structure over a substrate, forming an insulating material adjacent the fin structure, depositing a gate dielectric layer over the fin structure and the insulating material, depositing a gate electrode layer on the gate dielectric layer, forming an opening through the gate electrode layer and the gate dielectric layer into the insulating material, then performing an etch process that etches the gate dielectric layer at a faster rate than the gate electrode layer, and filling the opening with a dielectric material.

Another embodiment is a method. The method includes forming an insulating material over a substrate, depositing a gate dielectric layer on the insulating material, depositing a gate electrode layer on the gate dielectric layer, and performing a cyclic process to form an opening through the gate electrode layer and the gate dielectric layer into the insulating material. The cyclic process includes a plurality of cycles, and each cycle includes depositing a layer on the gate electrode layer, oxidizing the layer to form an oxide layer, removing a portion of the oxide layer, and performing a main etch process to remove a portion of the gate electrode layer. The method further includes performing an additional etch process that etches the gate dielectric layer at a faster rate than the gate electrode layer after the cyclic process and filling the opening with a dielectric material.

A further embodiment is a method. The method includes forming an insulating material over a substrate, depositing a gate dielectric layer on the insulating material, depositing a gate electrode layer on the gate dielectric layer, and performing a cyclic process to form an opening through the gate electrode layer and the gate dielectric layer into the insulating material. The cyclic process includes a plurality of cycles, and each cycle includes performing a main etch process to remove a portion of the gate electrode layer. The main etch process includes introducing a first chlorine-containing etchant at a first flow rate and a second chlorine-containing etchant at a second flow rate, and a ratio of the first flow rate to the second flow rate ranges from about 1:2 to about 1:6. Then, the method further includes performing an additional etch process that etches the gate dielectric layer at a faster rate than the gate electrode layer. The additional etch process includes introducing the first chlorine-containing etchant at a third flow rate and the second chlorine-containing etchant at a fourth flow rate, and a ratio of the third flow rate to the fourth flow rate ranges from about 5:1 to about 15:1. The method further includes filling the opening with a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
 forming a fin structure over a substrate;
 forming an insulating material adjacent the fin structure;
 depositing a gate dielectric layer over the fin structure and the insulating material;
 depositing a gate electrode layer on the gate dielectric layer;
 forming an opening through the gate electrode layer and the gate dielectric layer into the insulating material; then
 performing an etch process that etches the gate dielectric layer at a faster rate than the gate electrode layer; and
 filling the opening with a dielectric material.

2. The method of claim 1, wherein the fin structure comprises a plurality of semiconductor layers, and the gate dielectric layer and the gate electrode layer surround a portion of each semiconductor layer of the plurality of semiconductor layers.

3. The method of claim 1, wherein the etch process is a plasma etch process.

4. The method of claim 3, wherein a first chlorine-containing etchant and a second chlorine-containing etchant are used in the plasma etch process.

5. The method of claim 4, wherein the first chlorine-containing etchant etches the gate dielectric layer at a faster rate than the gate electrode layer, and the second chlorine-containing etchant etches the gate dielectric layer at a slower rate than the gate electrode layer.

6. The method of claim 5, wherein the first chlorine-containing etchant is introduced at a first flow rate, and the second chlorine-containing etchant is introduced at a second flow rate substantially slower than the first flow rate.

7. The method of claim 5, wherein the first chlorine-containing etchant comprises $BCl_3$, and the second chlorine-containing etchant comprises $Cl_2$.

8. The method of claim 1, wherein the etch process is a wet etch process.

9. A method, comprising:
 forming an insulating material over a substrate;
 depositing a gate dielectric layer on the insulating material;
 depositing a gate electrode layer on the gate dielectric layer;
 performing a cyclic process to form an opening through the gate electrode layer and the gate dielectric layer into the insulating material, wherein the cyclic process comprises a plurality of cycles, and each cycle comprises:
  depositing a layer on the gate electrode layer;
  oxidizing the layer to form an oxide layer;
  removing a portion of the oxide layer; and
  performing a main etch process to remove a portion of the gate electrode layer; then
 performing an additional etch process that etches the gate dielectric layer at a faster rate than the gate electrode layer; and filling the opening with a dielectric material.

10. The method of claim 9, wherein the layer is a silicon-containing layer, and the oxide layer is a silicon oxide layer.

11. The method of claim 10, wherein the portion of the oxide layer is formed on a horizontal surface.

12. The method of claim 11, wherein the main etch process comprises simultaneously introducing a first chlorine-containing etchant and a second chlorine-containing etchant.

13. The method of claim 12, wherein the first chlorine-containing etchant comprises $BCl_3$, and the second chlorine-containing etchant comprises $Cl_2$.

14. The method of claim 12, wherein the first chlorine-containing etchant is introduced at a first flow rate, and the second chlorine-containing etchant is introduced at a second flow rate substantially faster than the first flow rate.

15. The method of claim 14, wherein a ratio of the first flow rate to the second flow rate ranges from about 1:2 to about 1:6.

16. The method of claim 15, wherein the additional etch process comprises simultaneously introducing the first chlorine-containing etchant and the second chlorine-containing etchant, wherein the first chlorine-containing etchant is introduced at a third flow rate, and the second chlorine-containing etchant is introduced at a fourth flow rate substantially slower than the third flow rate.

17. The method of claim 16, wherein a ratio of the third flow rate to the fourth flow rate ranges from about 5:1 to about 15:1.

18. A method, comprising:
forming an insulating material over a substrate;
depositing a gate dielectric layer on the insulating material;
depositing a gate electrode layer on the gate dielectric layer;
performing a cyclic process to form an opening through the gate electrode layer and the gate dielectric layer into the insulating material, wherein the cyclic process comprises a plurality of cycles, and each cycle comprises:
performing a main etch process to remove a portion of the gate electrode layer, wherein the main etch process comprises introducing a first chlorine-containing etchant at a first flow rate and a second chlorine-containing etchant at a second flow rate, and a ratio of the first flow rate to the second flow rate ranges from about 1:2 to about 1:6; then
performing an additional etch process that etches the gate dielectric layer at a faster rate than the gate electrode layer, wherein the additional etch process comprises introducing the first chlorine-containing etchant at a third flow rate and the second chlorine-containing etchant at a fourth flow rate, and a ratio of the third flow rate to the fourth flow rate ranges from about 5:1 to about 15:1; and
filling the opening with a dielectric material.

19. The method of claim 18, wherein each cycle of the cyclic process has a first time duration, and the additional etch process has a second time duration substantially longer than the first time duration.

20. The method of claim 19, wherein the second time duration is about twice as long as the first time duration.

* * * * *